（12） United States Patent
Capriz et al.

(10) Patent No.: US 6,747,865 B2
(45) Date of Patent: Jun. 8, 2004

(54) HEAT SINK FOR ELECTRONIC COMPONENTS

(75) Inventors: Cesare Capriz, Bologna (IT); Ashok Patel, Concord, NH (US)

(73) Assignee: Aavid Thermalloy, LLC, Concord, NH (US)

( * ) Notice: Subject to any disclaimer, the term of this patent is extended or adjusted under 35 U.S.C. 154(b) by 0 days.

(21) Appl. No.: 10/121,177

(22) Filed: Apr. 12, 2002

(65) Prior Publication Data

US 2002/0196607 A1 Dec. 26, 2002

(30) Foreign Application Priority Data

Apr. 27, 2001 (IT) ...................................... BO2001A0257
Sep. 11, 2001 (IT) ...................................... BO2001A0542

(51) Int. Cl.$^7$ ................................................. H05K 7/20
(52) U.S. Cl. ...................... 361/679; 361/695; 165/124; 174/16.3
(58) Field of Search .................................. 361/680–687, 361/724–727, 695–697; 165/80.2, 80.3, 122, 124, 126, 185; 174/16.3

(56) References Cited

U.S. PATENT DOCUMENTS

| 5,661,638 | A | * | 8/1997 | Mira | ........................... | 361/697 |
| 5,758,418 | A | * | 6/1998 | Chrysler et al. | ......... | 29/890.03 |
| 6,478,284 | B2 | * | 11/2002 | Qiu | ............................. | 248/680 |
| 6,501,652 | B2 | * | 12/2002 | Katsui | ........................ | 361/697 |
| 6,525,939 | B2 | * | 2/2003 | Liang et al. | ................. | 361/697 |

* cited by examiner

Primary Examiner—Hung Van Duong
(74) Attorney, Agent, or Firm—Cohen, Pontani, Lieberman & Pavane (57) ABSTRACT

A heat sink for electronic components having a heat dissipator connected to at least one electronic component and a ventilator designed to supply the heat dissipator with air. The heat dissipator includes at least one thermally conductive plate connected to the electronic component and having a plurality of openings.

18 Claims, 8 Drawing Sheets

HEAT SINK FOR ELECTRONIC COMPONENTS

BACKGROUND OF THE INVENTION

1. Field of the Invention

The present invention relates to a heat sink for electronic components and a process for making the heat sink.

2. Description of the Related Art

Heat sinks are devices used to lower the temperature of electronic components and circuits by dissipating the heat these components and circuits produce during operation. They comprise a dissipating element usually consisting of a central element, associated to the electronic component and having a plurality of dissipating fins.

Heat sinks known to prior art include devices known as "active" heat sinks. This type of heat sink is equipped with a fan, positioned close to the dissipating element, which conveys air directly to the element in order to cool it. Through the fan, cooling occurs by forced convection and therefore much more quickly.

In these heat sinks, the shape of the dissipating elements, and especially of the fins, varies according to the amount of heat to be dispersed and the size of the electronic circuit to which the heat sink is applied. Once the shape of the dissipating element has been defined, the dissipating element can be made using any of several different known methods. For example, there are aluminium heat sinks made by extrusion, having a plurality of suitably cut fins, or made from die formed metal sheets.

Heat sinks may also be made by sintering and pressing metal powders. Heat sinks having fins that are glued or brazed on a plate and with or without holes in them, are also known in prior art. The manufacturing of heat sinks of this kind involves considerably complex processes and a high production cost.

Moreover, each heat sink must be adapted to a particular electronic circuit and positioned relative to the fan in such a way as to ensure the correct heat exchange. The heat sink, however, especially if series-produced, cannot always be adapted to the circuit to ensure optimum thermal performance.

SUMMARY OF THE INVENTION

The aim of the present invention is therefore to overcome the above mentioned disadvantages. The invention has for an aim, in particular, to provide a heat sink that is economical to make and, at the same time, provides good thermal performance.

Yet another aim of the present invention is to provide a heat sink that is easy to make and can be series-produced without limiting thermal performance.

A heat sink for an electronic component comprising heat dissipating means connected to at least one electronic component, the dissipating means having at least one thermally conductive plate having a plurality of openings and being attachable to the electronic component ventilation means for supplying the heat dissipating means with air.

A process for making a heat sink for electronic comprising the steps of forming at least one thermally conductive plate having a plurality of openings joining the plate to a thermally conductive base, the base accommodating connection to at least one electronic component.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference numerals represent similar elements throughout the views.

DETAILED DESCRIPTION OF THE PRESENTLY PREFERRED EMBODIMENTS

With reference to the accompanying drawings, the numeral 1 denotes a heat sink for electronic components.

Figure 11:
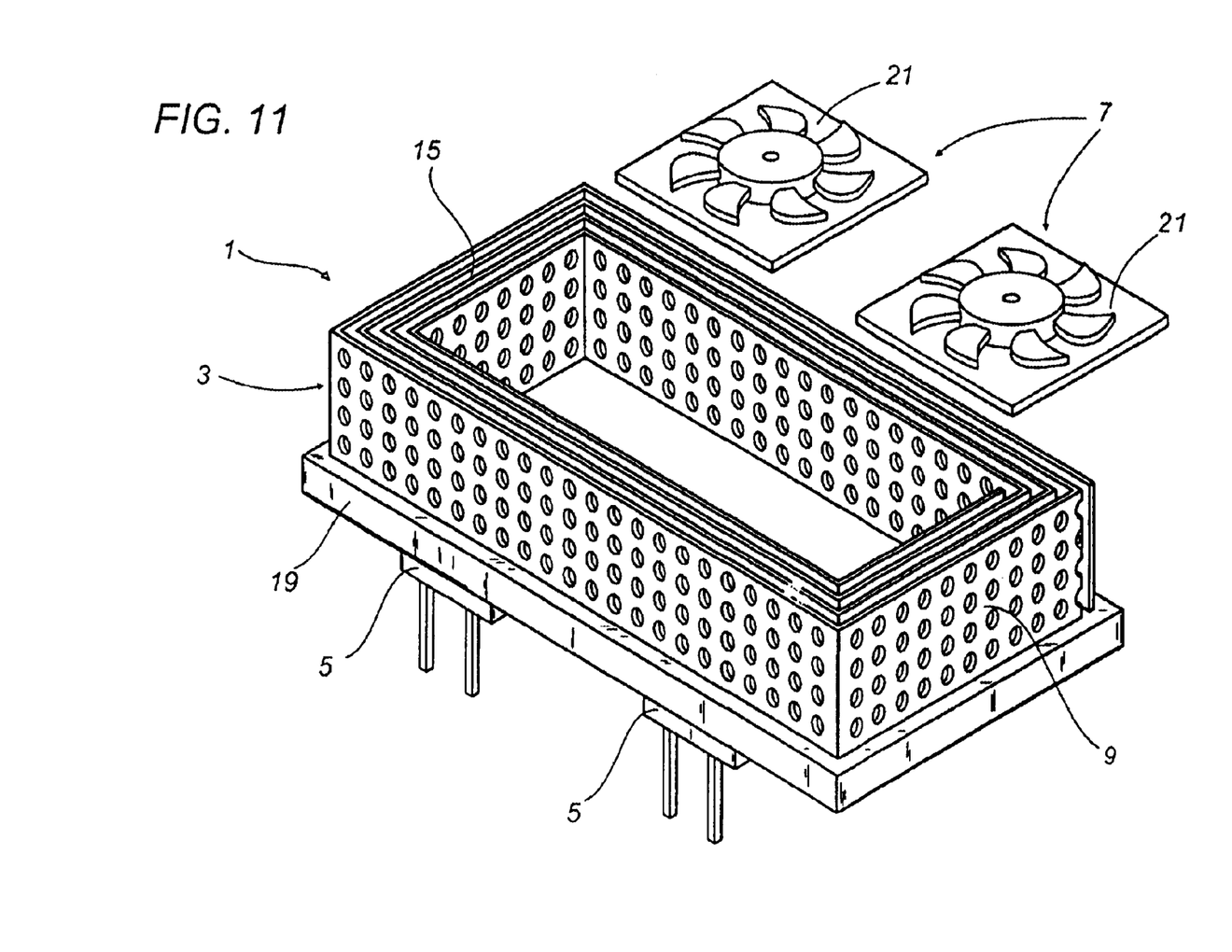
FIG. 11 is perspective view of yet another embodiment of the heat sink according to the invention.
Figure 12:
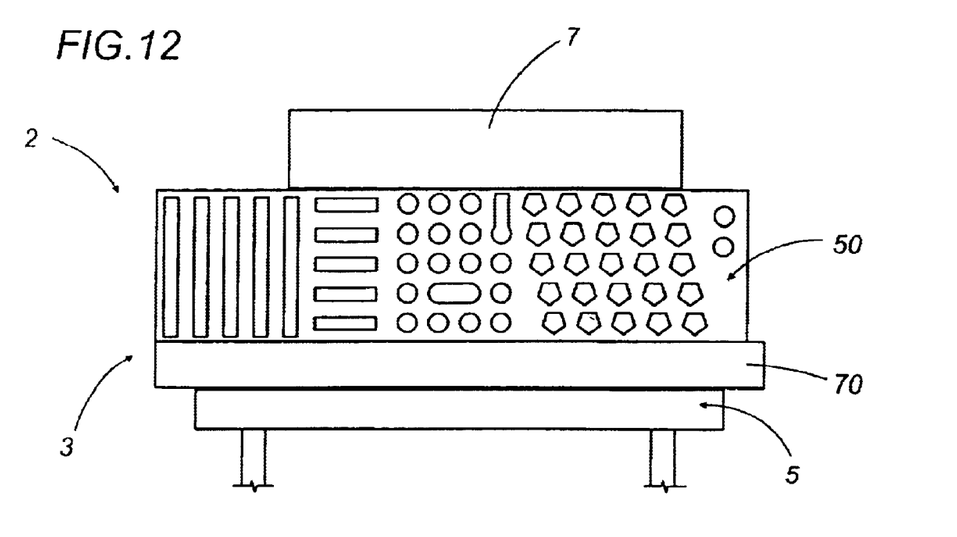
FIG. 12 is a schematic side view of a heat sink for electronic components according to the present invention.

The heat sink 1 comprises heat dissipating means 3 connected to at least one electronic component 5 which generates a certain amount of heat during its operation. The heat sink 1 is also equipped with ventilation means 7 which supply the dissipating means 3 with air in order to cool them. According to the present invention, the dissipating means 3 comprise at least one thermally conductive plate 9 attached to the electronic component 5 and having a plurality of openings 11. The plate 9 is joined, for example by brazing, to a base 19 which is also thermally conductive. The base 19 is placed in contact with and connected to the electronic component 5 from which the heat must be removed. The plate 9 is associated to the base 19, which may be made in the form of a board, for example, along a face 13 forming the thickness s of the plate 9 itself, so that the heat exchange surface comprises the entire lateral surface of the plate 9. Advantageously, the metal plate 9 consists of wire netting (FIGS. 2 and 4) or stretched or perforated metal sheeting with a network of openings that may be rhomboidal (FIG. 1), or circular (FIG. 2) or any other suitable shape (FIG. 11). According to the present invention, the plate 9 is shaped in such a way as to create at least one channel 15 through which the air supplied by the ventilation means 7 can pass.

Figure 1:
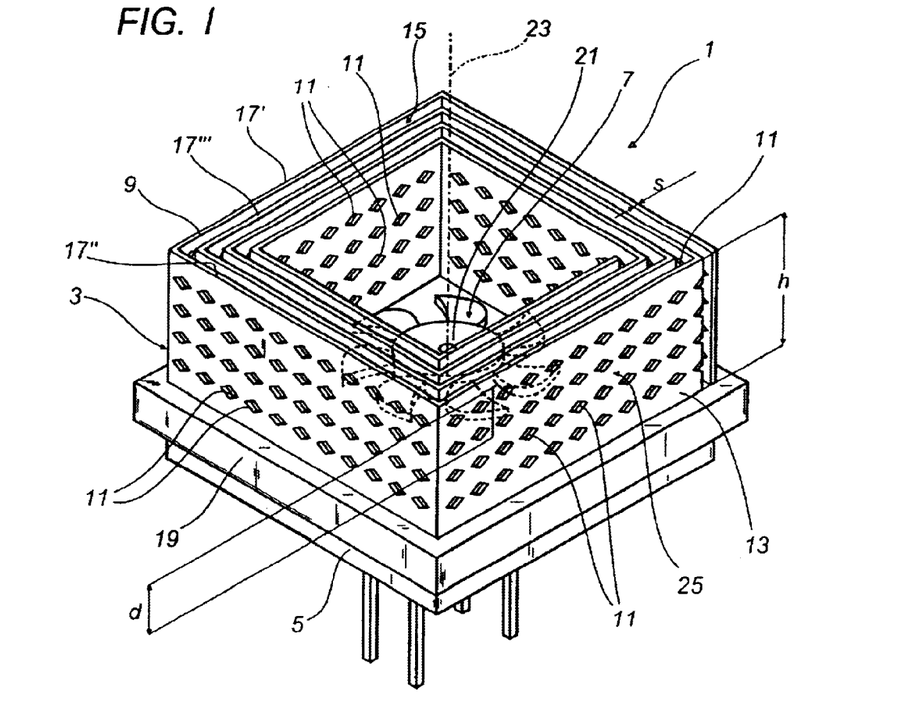
FIG. 1 is a perspective view of a first preferred embodiment of a heat sink according to the invention.

In a first preferred embodiment of the invention, illustrated in FIG. 1, the plate 9 extends in a longitudinal direction for a defined length and is then bent with respect to the longitudinal direction in such a way as to form a consecutive series of contiguous plate portions 17 at a defined angle to each other. As shown in FIG. 1, the plate 9 is bent in such a way that the width of each portion 17 decreases from one portion 17' to the next 17" so that the consecutive series of plate portions 17 forms a spiral where the air passage channel 15 is created by two non-contiguous portions 17', 17'''.

Figure 2:
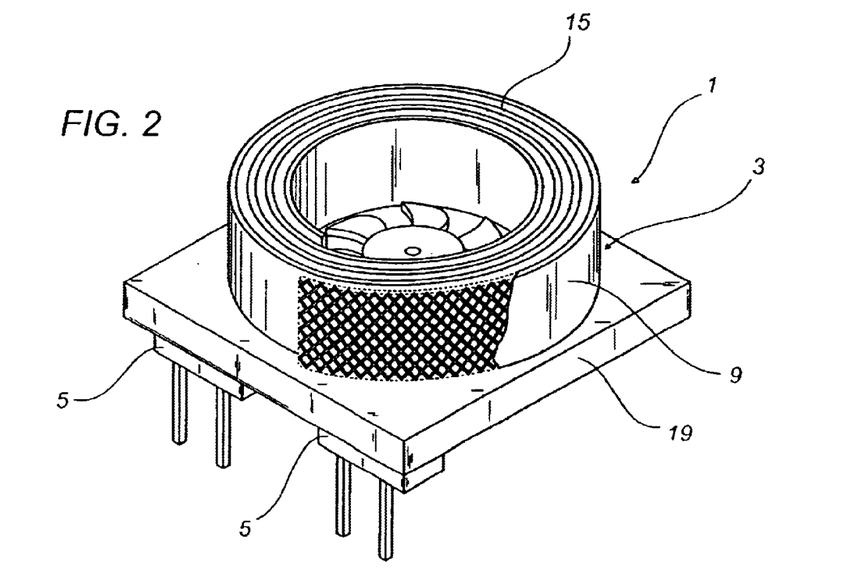
FIG. 2 is a perspective view of a second preferred embodiment of a heat sink according to the invention.

In a second preferred embodiment of the dissipating means 3, illustrated in FIG. 2, the plate 9 is wound in such a way as to form a circular spiral without sharp edges to create an air passage channel 15.

Figure 3:
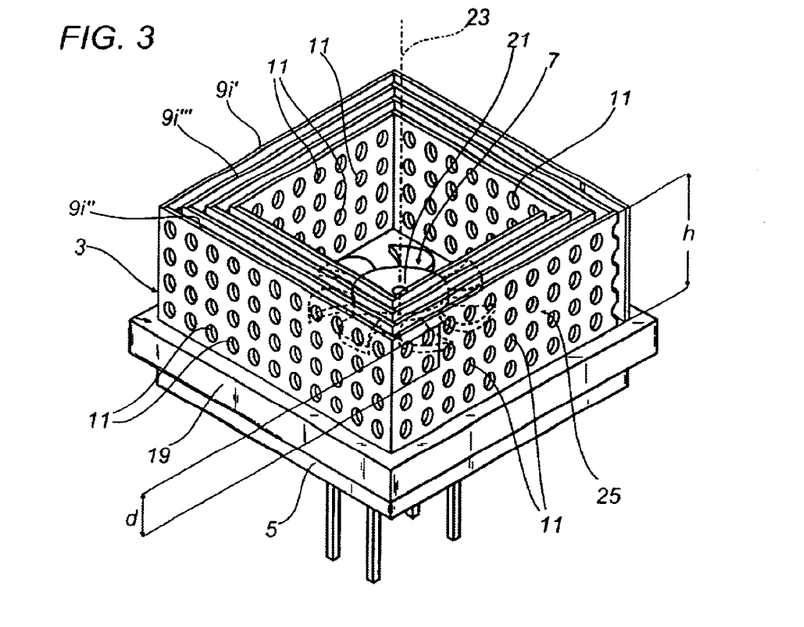
FIG. 3 is a perspective view of a third preferred embodiment of a heat sink.

In a third preferred embodiment illustrated in FIG. 3, the dissipating means 3 comprise a plurality of plates 9i positioned in sequence and side by side in such a way as to create the channel 15 for the passage of the air supplied by the ventilation means 7. The contiguous plates 9i', 9i" are positioned at a defined angle to each other—for example, at right angles, as shown in FIG. 3—and decrease in width in such a way as to create a spiral where two non-contiguous plates 9i', 9i''', positioned side by side create the channel 15 for the passage of the cooling air.

Figure 4:
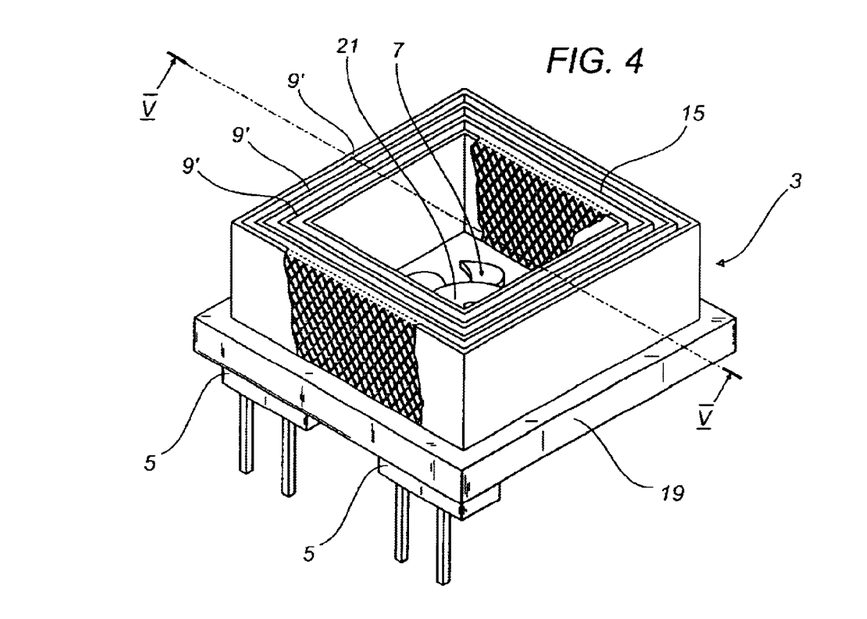
FIG. 4 is a perspective view of a fourth preferred embodiment of a heat sink.

FIG. 4 shows a fourth preferred embodiment of the dissipating means 3, where a plurality of plates 9' bent into any of several shapes (square, circular or, as in FIG. 4, rectangular) are positioned in substantially concentric fashion to create air passage channels 15.

According to the present invention, the ventilation means 7 consist of at least one fan 21 whose axis 23 is substantially parallel to the plane 25 of each plate 9i, 9' or plate portion 17.

Figure 5:
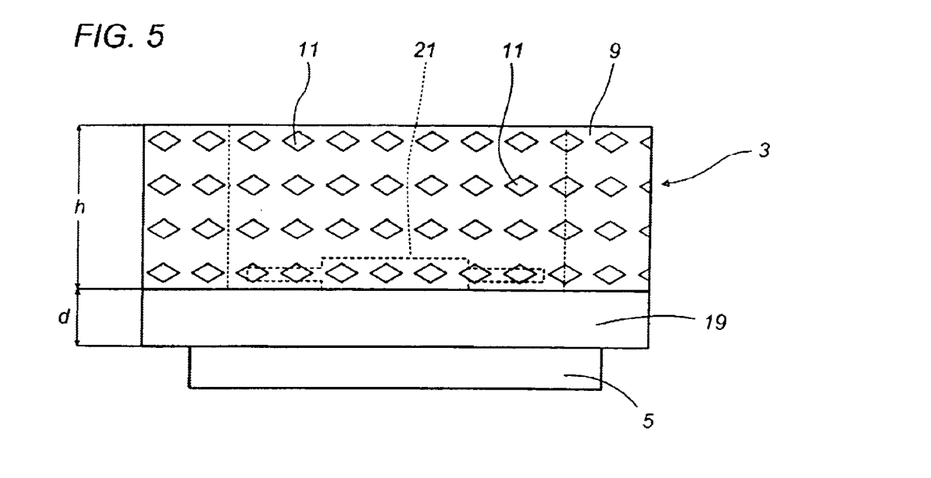
FIG. 5 is a front view of the heat sink shown in FIG. 1.
Figure 6:
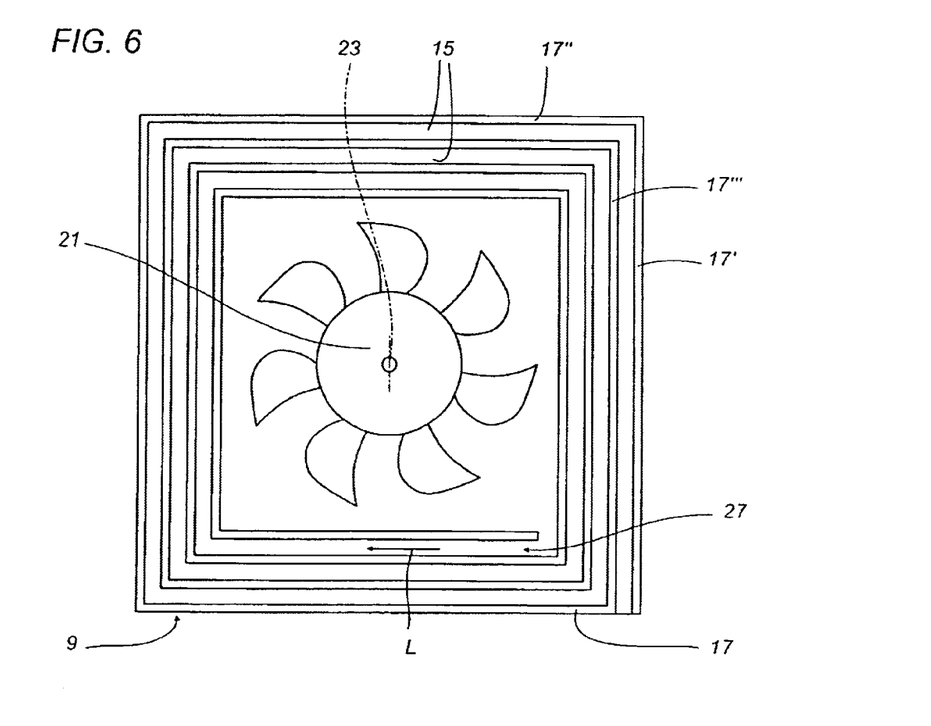
FIG. 6 is a top view of the heat sink shown in FIG. 1.
Figure 7:
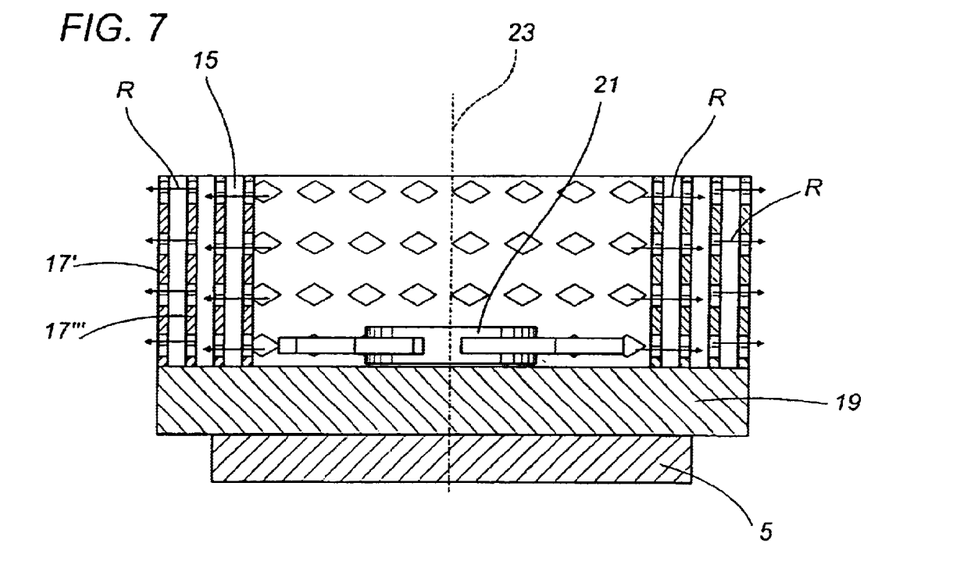
FIG. 7 shows the heat sink of FIG. 1 in a cross section through line V—V in FIG. 4.

In a first embodiment, as illustrated in particular in FIGS. 5–7, the fan 21 is positioned at a distance d from the electronic component 5 that is less than the height h of the plate 9. The fan 21 is positioned inside the spiral at a halfway position with respect to the height h of the plate 9. Thus, the air is conveyed by the fan 21 in the radial direction R towards the innermost plate portions 17 of the spiral and towards the inlet 27 of the channel 15 formed by the spiral itself. Hence, the air is moved within the channel 15 not only in the direction L but also radially in the direction R through the openings 11 made in the plate 9 (FIGS. 6 and 7). The movement of the air in different directions creates a turbulent motion which facilitates heat exchange and thus cools the plate down more rapidly.

Figure 8:
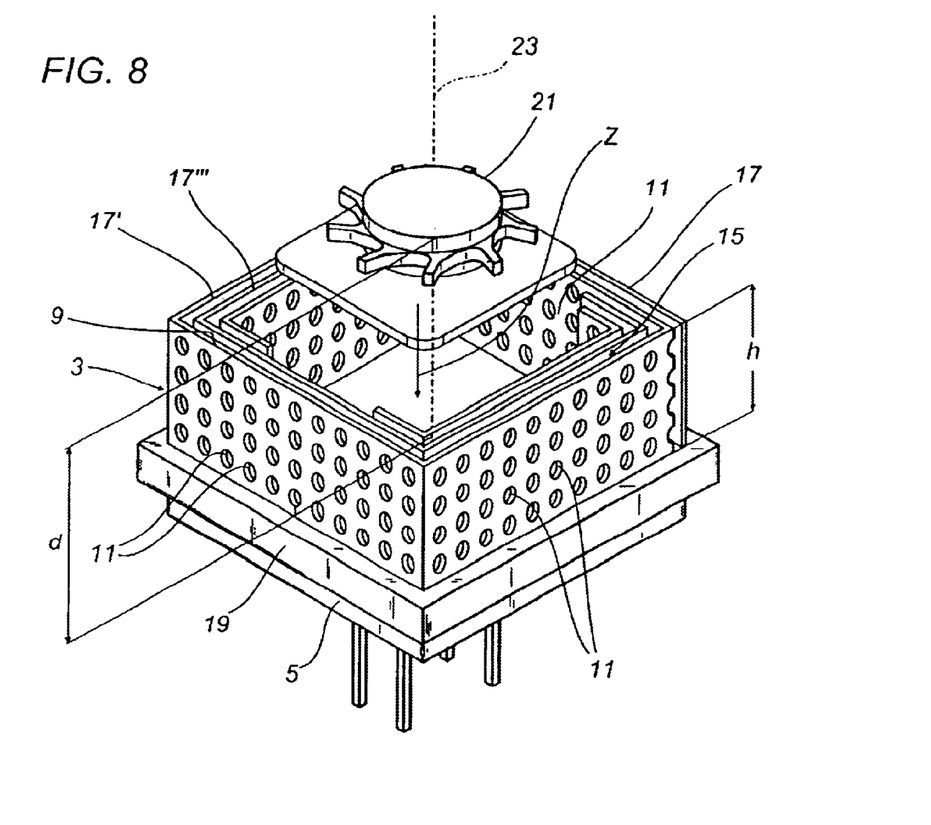
FIG. 8 is perspective view of another embodiment of the heat sink according to the invention.
Figure 9:
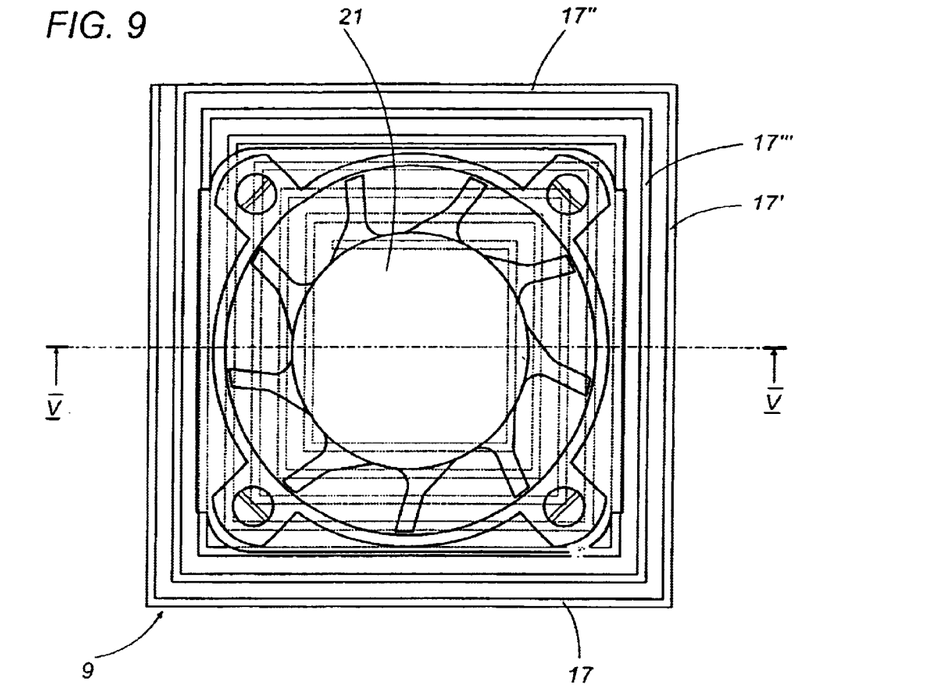
FIG. 9 is a top view of the heat sink shown in FIG. 8.
Figure 10:
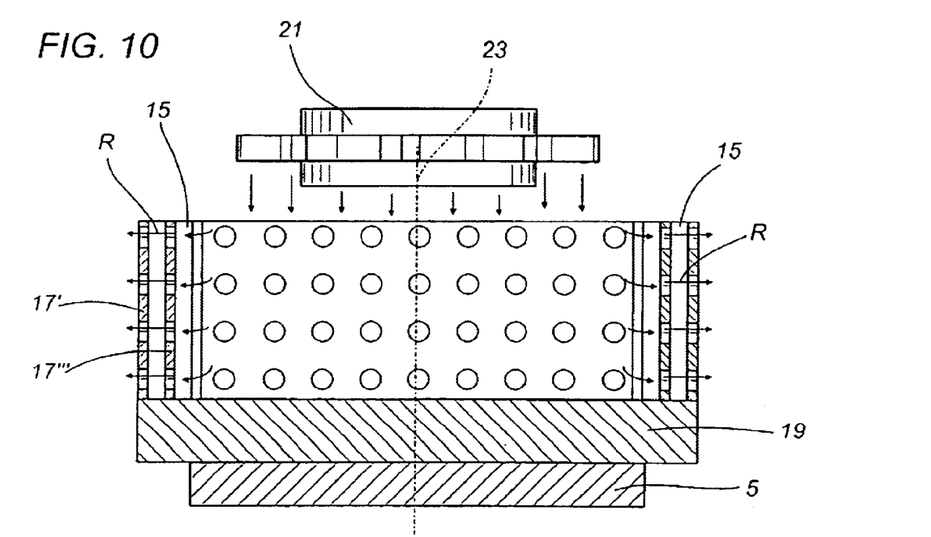
FIG. 10 shows the heat sink of FIG. 8 in a cross section through line VIII—VIII in FIG. 9.

In a second embodiment, illustrated in FIGS. 8–10, the fan 21 is positioned at a distance d from the electronic component 5 that is greater than the height h of the plate 9.

In this embodiment, the air is conveyed by the fan 21 in the direction Z directly towards the base board 19 that is in contact with the electronic component 5 where heat is generated. The air then passes over the plane 25 of the plate portions 17, cooling them, and, through the openings 11, is transferred partly into the channel 15 and in radial direction, favouring convective motion and, hence, heat exchange (FIG. 10).

In another embodiment, illustrated in FIG. 11, the ventilation means 7 comprise two fans 21, 21' positioned outside the spiral.

In a variant of this embodiment, the dissipating means 3 may comprise (see also FIGS. 12 to 15): a plurality of straight, thermally conductive plates 50 positioned parallel to each other in succession, and a base 70 to which the plurality of plates 50 is connected and whose free surface is attachable to the electronic component or components 5 to be cooled. The plurality of plates 50 presents a plurality of openings 60 passing through its dissipating surface and constituting corresponding zones allowing the passage of the air supplied by the ventilation means 7. Each plate 50 is joined, preferably by brazing, to the base 70, which is made, for example, in the form of a board. As shown in the drawings, each plate 50, consisting, for example, of a stretched sheet, is applied to the base board 70 along one of its faces forming the thickness of the plate 50 itself, in such a way that the heat exchange surface comprises the entire lateral surface of each plate 50.

Again as shown in FIGS. 12 to 15, the ventilation means 7 consist of at least one fan, positioned close to the plurality of plates 50 and having an axis that is parallel to the plane in which the plates 50 themselves extend. More specifically, the fan 7 may be positioned above the plurality of plates 50, again with its axis parallel to the plane in which the plates 50 extend. Alternatively, the fan 7 may be positioned inside a space 80 delimited by the break in a part of the plurality of plates 50 (see FIG. 15 and dashed line in FIG. 14).

Figure 13:
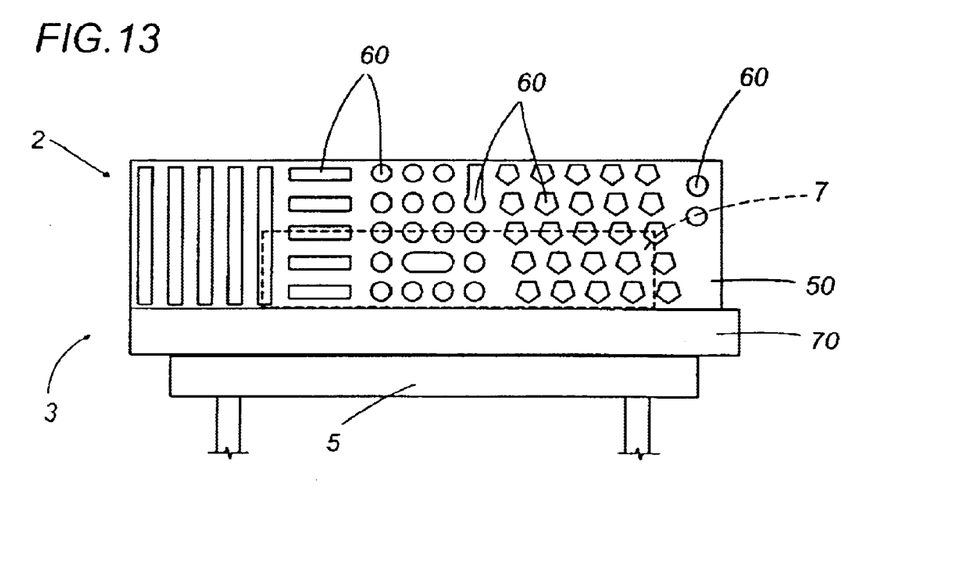
FIG. 13 illustrates in a schematic side view a variant of the embodiment of the heat sink of FIG. 1.
Figure 14:
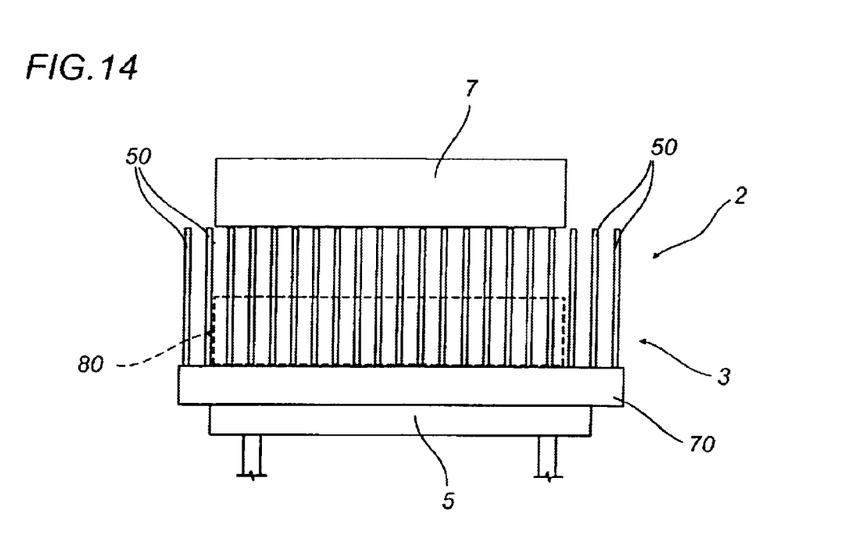
FIG. 14 is a schematic front view of the heat sink shown in FIGS. 1 and 2.
Figure 15:
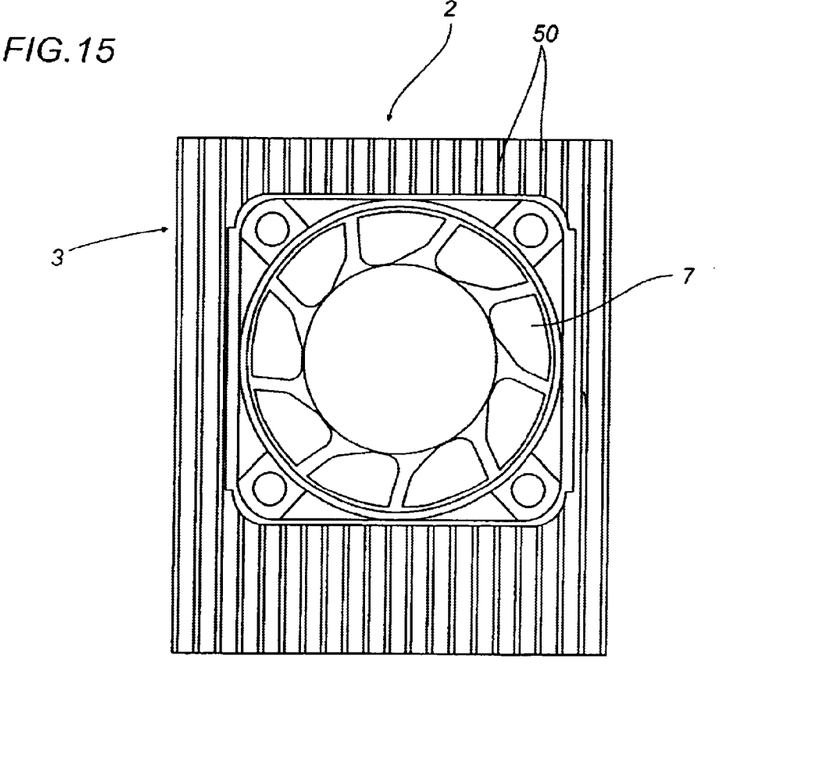
FIG. 15 is a schematic top plan view of the heat sink according to the invention.

As shown in FIG. 13, each of the plates 50 presents a plurality of the openings 60, which may be circular, quadrangular or polygonal and uniformly distributed over the heat exchange surface of the plate 50. The shape of the holes may be determined by the dissipating efficiency required or by the thickness of the plates 50. The structure of the parallel plates 50, together with the openings 60 made in the plates 50 themselves, combined with the action of the fan 7, conveys the air rapidly along the passages formed by the plates 50 and through the openings 60, in such a way as to create very rapid flows both lengthways and crossways with respect to the heat sink.

The invention also provides a process for making a heat sink 1 comprising the steps of making at least one thermally conductive plate 9 having a plurality of openings 11 and joining the plate 9 to a thermally conductive base 19, which may be made in the form of a board, for example, and which may be connected to at least one electronic component 5. The plate 9 may be joined to the base board 19 by brazing, for example. Before being joined to the base board 19, the plate 9 is shaped in such a way as to form at least one channel 15 through which the cooling air can pass. Advantageously, the plate 9 is shaped into a spiral.

In a first embodiment of the process according to the invention, this spiral configuration is obtained by bending a continuous plate 9 into a circular shape or in such a way as to form a consecutive series of contiguous plate portions 17 at a defined angle to each other.

In a second preferred embodiment of the process, a plurality of plates 9i are positioned in sequence and side by side in such a way as to form a spiral configuration delimiting the channel 15 for the passage of the cooling air.

In another embodiment of the process, each of a set of plates 9' is bent into a closed shape and the plates 9' are then positioned in a substantially concentric fashion to create the channels 15 for the passage of the cooling air. The heat sink according to the invention is easy to make since it does not require special machining processes to obtain optimum shapes. It is in fact sufficient to make a stretched or uniformly perforated metal sheet, bend it into a required shape and apply it to the thermally conductive base. The metal sheet is therefore easy to adapt to circuits of different sizes which generate different quantities of heat. That means there is no need to make a different dissipating element for each different circuit. Further, thanks to the adaptability of the metal sheet, heat exchange can be optimized easily, whatever the configuration of the electronic circuit. Series production of the heat sink is therefore possible, which means a lower production cost without reducing the thermal performance of the heat sink. Moreover, the spiral or concentric geometry configuration, combined with the openings in the plate, permits optimization of heat exchange by forced convection using either an axial-flow fan or a radial fan. In particular, if a radial fan is used, the spiral configuration enables the fan to be positioned inside the bent plate constituting the dissipating element. This has obvious advantages in terms of reduced size.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A heat sink for an electronic component comprising:
   heat dissipating means connected to the electronic component, the dissipating means having a plurality of thermally conductive plates positioned parallel to each other in succession and having a plurality of openings passing through its dissipating surface and constituting corresponding air passage zones;
   a base to which the plurality of plates is connected, said base having a free surface attachable to the electronic component, said heat dissipating means being attachable to the electronic component; and
   ventilation means for supplying the heat dissipating means with air.

2. The heat sink according to claim 1, characterized in that the metal plate has a spiral configuration.

3. The heat sink according to claim 1, characterized in that the metal plate is bent in such a way as to form a sequence of contiguous plate portions positioned at a defined angle to each other.

4. The heat sink according to claim 1, characterized in that the plurality of plates are positioned in succession to form a spiral configuration.

5. The heat sink according to claim 1, wherein the plurality of plates are bent and positioned in a substantially concentric fashion.

6. The heat sink according to claim 1, characterized in that the ventilation means comprises at least one fan whose axis is substantially parallel to the plane of the at least one plate.

7. The heat sink according to claim 1, characterized in that the at least one plate is made from wire netting.

8. The heat sink according to claim 1, characterized in that the at least one plate is made from a stretched metal sheet.

9. The heat sink according to claim 1, characterized in that the at least one plate is made from a perforated metal sheet.

10. The heat sink according to claim 1, characterized in that the ventilation means consist of at least one fan positioned close to the plurality of plates and having an axis that is parallel to the plane in which the plates extend.

11. The heat sink according to claim 1, characterized in that the ventilation means consist of at least one fan positioned above the plurality of plates and having an axis that is parallel to the plane in which the plates extend.

12. The heat sink according to claim 1, characterized in that the ventilation means consist of at least one fan whose axis is parallel to the plane in which the plates extend and which is positioned within a space delimited by a break in a part of the plurality of plates.

13. The heat sink according to claim 1, characterized in that each plate is connected to the base by brazing.

14. The heat sink according to claim 1, characterized in that each plate presents a plurality of the openings, which are circular and uniformly distributed over its surface.

15. The heat sink according to claim 1, characterized in that each plate presents a plurality of the openings, which are quadrangular and uniformly distributed over its surface.

16. The heat sink according to claim 1, characterized in that each plate presents a plurality of the openings, which are polygonal and uniformly distributed over its surface.

17. The heat sink according to claim 6, characterized in that the fan is positioned at a distance from the electronic component that is greater than the height of the at least one plate.

18. The heat sink according to claim 6, characterized in that the fan is positioned at a distance from the electronic component that is less than the height of the at least one plate.

* * * * *